US006829258B1

(12) United States Patent
Carlisle et al.

(10) Patent No.: US 6,829,258 B1
(45) Date of Patent: Dec. 7, 2004

(54) RAPIDLY TUNABLE EXTERNAL CAVITY LASER

(75) Inventors: Clinton B. Carlisle, Palo Alto, CA (US); Jahja I. Trisnadi, Cupertino, CA (US)

(73) Assignee: Silicon Light Machines, Inc., Sunnyvale, CA (US)

( * ) Notice: Subject to any disclaimer, the term of this patent is extended or adjusted under 35 U.S.C. 154(b) by 25 days.

(21) Appl. No.: 10/183,585

(22) Filed: Jun. 26, 2002

(51) Int. Cl.[7] .......................... H01S 3/10; G02B 27/10; G02B 5/18; G02B 26/08; H01J 5/16
(52) U.S. Cl. ...................... 372/20; 359/627; 359/572; 359/298; 250/237
(58) Field of Search ..................................... 372/18–20

(56) References Cited

U.S. PATENT DOCUMENTS

| 1,525,550 A | 2/1925 | Jenkins |
| 1,548,262 A | 8/1925 | Freedman |
| 1,814,701 A | 7/1931 | Ives |

(List continued on next page.)

OTHER PUBLICATIONS

Beck Mason et al., "Directly Modulated Sampled Grating DBR Lasers for Long–Haul WDM Communication Systems", IEEE Photonics Technology Letters, vol. 9, No. 3, Mar. 1997, pp. 377 of 379.
N. J. Frigo et al., "A Wavelength–Division Multiplexed Passive Optical Network with Cost–Shared Components", IEEE Photonics Technology Letters, vol. 6, No. 11, Nov. 1994, pp. 1365 of 1367.
M. S. Goodman et al., "The LAMBDANET Multiwavelength Network: Architecture, Applications, and Demonstrations", IEEE Journal on Selected Areas in Communications, vol. 8, No. 6, Aug. 1990, pp. 995 of 1004.
C. A. Turkatte, "Examining the Benefits of Tunable Lasers for Provisioning Bandwidth on Demand", EuroForum–Optical Components, Feb. 2000, pp. 1 of 10.
R. Plastow, "Tunable Lasers and Future Optical Networks," Compound Semiconductors, vol. 6, No. 6, Aug. 2000, pp. 58 of 62.
New Focus, Inc., product literature on the Vortex and Velocity series ECDLa, 1999.
C. Duvall, "VCSELs may make metro networks dynamic", WDM Solutions, Nov. 2000.

Primary Examiner—Paul Ip
Assistant Examiner—Phillip Nguyen
(74) Attorney, Agent, or Firm—Okamoto & Benedicto LLP

(57) ABSTRACT

An external cavity laser comprises a laser source, a collimation optical element, a blazed diffraction grating, a transform optical element, and a light modulator. The laser source produces a light output comprising a range of light wavelengths. The collimation optical element couples the laser source to the blazed diffraction grating. The collimation optical element collimates the light output. The blazed diffraction grating diffracts the light output into a first diffraction order. The transform optical element couples the blazed diffraction grating to the light modulator, which is located in a transform plane of the transform optical element. The transform optical element converts the first diffraction order to position in the transform plane by focusing the range of light wavelengths to the transform plane. The light modulator comprises an array of light modulating pixels selectively operable in first mode and second modes. A particular light modulating pixel in the first mode reflects light along a return path. The particular light modulating pixel in the second mode directs light away from the return path. The first mode is selectively operable to adjust a return path length by at least a half wavelength. In operation at least one of the light modulating pixels operates in the first mode returning a lasing wavelength along the return path and creating a resonant cavity for the lasing wavelength while operating a remainder of the light modulating pixels in the second mode to direct a remainder of the range of light wavelengths away from the return path.

19 Claims, 4 Drawing Sheets

U.S. PATENT DOCUMENTS

| | | | |
|---|---|---|---|
| 2,415,226 A | 2/1947 | Szikiai | 178/5.4 |
| 2,783,406 A | 2/1957 | Vanderhooft | 313/70 |
| 2,920,529 A | 1/1960 | Blythe | 88/73 |
| 2,991,690 A | 7/1961 | Grey et al. | 88/16.6 |
| 3,256,456 A | 6/1966 | Weissenstern et al. | 317/101 |
| 3,388,301 A | 6/1968 | James | 317/234 |
| 3,443,871 A | 5/1969 | Chitayat | 356/106 |
| 3,553,364 A | 1/1971 | Lee | 176/7.3 |
| 3,576,394 A | 4/1971 | Lee | 178/7.3 |
| 3,600,798 A | 8/1971 | Lee | 29/592 |
| 3,656,837 A | 4/1972 | Sandbark | 350/161 |
| 3,657,610 A | 4/1972 | Yamamoto et al. | 317/243 |
| 3,693,239 A | 9/1972 | Dix | 29/470 |
| 3,743,507 A | 7/1973 | Ih et al. | 96/81 |
| 3,752,563 A | 8/1973 | Torok et al. | 350/151 |
| 3,781,465 A | 12/1973 | Erntoff et al. | 178/5.4 BD |
| 3,783,184 A | 1/1974 | Ernstoff et al. | 178/5.4 BD |
| 3,792,916 A | 2/1974 | Sama | 350/163 |
| 3,802,769 A | 4/1974 | Rotz et al. | 352/43 |
| 3,811,186 A | 5/1974 | Lamard et al. | 29/626 |
| 3,861,784 A | 1/1975 | Torok | 350/162 R |
| 3,862,360 A | 1/1975 | Dill et al. | 178/7.3 D |
| 3,871,014 A | 3/1975 | King et al. | 357/67 |
| 3,886,310 A | 5/1975 | Guldberg et al. | 178/7.8 D |
| 3,896,338 A | 7/1975 | Nathanson et al. | 315/373 |
| 3,915,548 A | 10/1975 | Opittek | 350/3.5 |
| 3,935,499 A | 1/1976 | Oess | 313/413 |
| 3,935,500 A | 1/1976 | Oess et al. | 313/495 |
| 3,938,881 A | 2/1976 | Biegelsen et al. | 350/161 |
| 3,941,456 A | 3/1976 | Schilz et al. | 350/161 |
| 3,942,245 A | 3/1976 | Jackson et al. | 29/591 |
| 3,943,281 A | 3/1976 | Keller et al. | 178/7.5 D |
| 3,947,105 A | 3/1976 | Smith | 353/121 |
| 3,969,611 A | 7/1976 | Fonteneau | 219/502 |
| 3,980,476 A | 9/1976 | Wysocki | 96/1.1 |
| 3,991,416 A | 11/1976 | Byles et al. | 340/324 R |
| 4,001,663 A | 1/1977 | Bray | 321/2 |
| 4,004,849 A | 1/1977 | Shattuck | 350/160 R |
| 4,006,968 A | 2/1977 | Ernstoff et al. | 350/160 LC |
| 4,009,939 A | 3/1977 | Okano | 350/162 SF |
| 4,012,116 A | 3/1977 | Yevick | 350/132 |
| 4,012,835 A | 3/1977 | Wallick | 29/591 |
| 4,017,158 A | 4/1977 | Booth | 350/162 SF |
| 4,020,381 A | 4/1977 | Oess et al. | 313/302 |
| 4,021,766 A | 5/1977 | Aine | 338/2 |
| 4,034,211 A | 7/1977 | Horst et al. | 235/61.12 N |
| 4,034,399 A | 7/1977 | Drukier et al. | 357/88 |
| 4,035,068 A | 7/1977 | Rawson | 353/122 |
| 4,067,129 A | 1/1978 | Abramson et al. | 40/563 |
| 4,084,437 A | 4/1978 | Finnegan | 73/361 |
| 4,090,219 A | 5/1978 | Ernstoff et al. | 358/59 |
| 4,093,346 A | 6/1978 | Nishino et al. | 350/162 SF |
| 4,093,921 A | 6/1978 | Buss | 325/459 |
| 4,093,922 A | 6/1978 | Buss | 325/459 |
| 4,100,579 A | 7/1978 | Ernstoff | 358/230 |
| 4,103,273 A | 7/1978 | Keller | 338/2 |
| 4,126,380 A | 11/1978 | Borm | 350/266 |
| 4,127,322 A | 11/1978 | Jacobson et al. | 353/31 |
| 4,135,502 A | 1/1979 | Peck | 126/76.5 |
| 4,139,257 A | 2/1979 | Matsumoto | 350/6.1 |
| 4,143,943 A | 3/1979 | Rawson | 350/120 |
| 4,163,570 A | 8/1979 | Greenaway | 283/8 A |
| 4,184,700 A | 1/1980 | Greenaway | 283/6 |
| 4,185,891 A | 1/1980 | Kaestner | 350/167 |
| 4,190,855 A | 2/1980 | Inoue | 357/80 |
| 4,195,915 A | 4/1980 | Lichty et al. | 350/345 |
| 4,205,428 A | 6/1980 | Ernstoff et al. | 29/592 R |
| 4,211,918 A | 7/1980 | Nyfeler et al. | 235/454 |
| 4,223,050 A | 9/1980 | Nyfeler et al. | 427/163 |
| 4,225,913 A | 9/1980 | Bray | 363/97 |
| 4,249,796 A | 2/1981 | Sincerbox et al. | 350/370 |
| 4,250,217 A | 2/1981 | Greenaway | 428/161 |
| 4,250,393 A | 2/1981 | Greenaway | 250/566 |
| 4,256,787 A | 3/1981 | Shaver et al. | 428/1 |
| 4,257,016 A | 3/1981 | Kramer, Jr. et al. | 322/7.51 |
| 4,290,672 A | 9/1981 | Whitefield | 350/358 |
| 4,295,145 A | 10/1981 | Latta | 346/108 |
| 4,311,999 A | 1/1982 | Upton et al. | 340/755 |
| 4,327,411 A | 4/1982 | Turner | 364/900 |
| 4,327,966 A | 5/1982 | Bloom | 350/162 R |
| 4,331,972 A | 5/1982 | Rajchman | 358/60 |
| 4,336,982 A | 6/1982 | Rector, Jr. | 350/358 |
| 4,338,660 A | 7/1982 | Kelley et al. | 364/200 |
| 4,343,535 A | 8/1982 | Bleha, Jr. | 350/342 |
| 4,346,965 A | 8/1982 | Sprague et al. | 350/358 |
| 4,348,079 A | 9/1982 | Johnson | 350/358 |
| 4,355,463 A | 10/1982 | Burns | 29/827 |
| 4,361,384 A | 11/1982 | Bosserman | 350/174 |
| 4,369,524 A | 1/1983 | Rawson et al. | 455/606 |
| 4,374,397 A | 2/1983 | Mir | 358/75 |
| 4,389,096 A | 6/1983 | Hori et al. | 350/339 R |
| 4,391,490 A | 7/1983 | Hartke | 350/356 |
| 4,396,246 A | 8/1983 | Holman | 350/96.14 |
| 4,398,798 A | 8/1983 | Krawczak et al. | 350/162.24 |
| 4,400,740 A | 8/1983 | Traino et al. | 358/293 |
| 4,408,884 A | 10/1983 | Kleinknecht et al. | 356/355 |
| 4,414,583 A | 11/1983 | Hooker, III | 358/300 |
| 4,417,386 A | 11/1983 | Exner | 29/590 |
| 4,418,397 A | 11/1983 | Brantingham et al. | 364/900 |
| 4,420,717 A | 12/1983 | Wallace et al. | 318/696 |
| 4,422,099 A | 12/1983 | Wolfe | 358/293 |
| 4,426,768 A | 1/1984 | Black et al. | 29/583 |
| 4,430,584 A | 2/1984 | Someshwar et al. | 307/465 |
| 4,435,041 A | 3/1984 | Torok et al. | 350/162.24 |
| 4,440,839 A | 4/1984 | Mottier | 430/2 |
| 4,443,819 A | 4/1984 | Funada et al. | 358/236 |
| 4,443,845 A | 4/1984 | Hamilton et al. | 364/200 |
| 4,447,881 A | 5/1984 | Brantingham et al. | 364/488 |
| 4,454,591 A | 6/1984 | Lou | 364/900 |
| 4,456,338 A | 6/1984 | Gelbart | 350/358 |
| 4,460,907 A | 7/1984 | Nelson | 346/153.1 |
| 4,462,046 A | 7/1984 | Spight | 358/101 |
| 4,467,342 A | 8/1984 | Tower | 357/30 |
| 4,468,725 A | 8/1984 | Venturini | 363/160 |
| 4,483,596 A | 11/1984 | Marshall | 350/385 |
| 4,484,188 A | 11/1984 | Ott | 340/728 |
| 4,487,677 A | 12/1984 | Murphy | 204/247 |
| 4,492,435 A | 1/1985 | Banton et al. | 350/360 |
| 4,503,494 A | 3/1985 | Hamilton et al. | 364/200 |
| 4,511,220 A | 4/1985 | Scully | 350/403 |
| 4,538,883 A | 9/1985 | Sprague et al. | 350/356 |
| 4,545,610 A | 10/1985 | Lakritz et al. | 29/589 |
| 4,556,378 A | 12/1985 | Nyfeler et al. | 425/143 |
| 4,558,171 A | 12/1985 | Gantley et al. | 174/52 FP |
| 4,561,011 A | 12/1985 | Kohara et al. | |
| 4,561,044 A | 12/1985 | Ogura et al. | 362/84 |
| 4,566,935 A | 1/1986 | Hornbeck | 156/826 |
| 4,567,585 A | 1/1986 | Gelbart | 369/97 |
| 4,571,041 A | 2/1986 | Gaudyn | 353/10 |
| 4,571,603 A | 2/1986 | Hornbeck et al. | 346/160 |
| 4,577,932 A | 3/1986 | Gelbart | 350/358 |
| 4,577,933 A | 3/1986 | Yip et al. | 350/358 |
| 4,588,957 A | 5/1986 | Balant et al. | 330/4.3 |
| 4,590,548 A | 5/1986 | Maytum | 363/161 |
| 4,594,501 A | 6/1986 | Culley et al. | 219/492 |
| 4,596,992 A | 6/1986 | Hornbeck | 346/76 PH |
| 4,615,595 A | 10/1986 | Hornbeck | 353/122 |
| 4,623,219 A | 11/1986 | Trias | 350/351 |
| 4,636,039 A | 1/1987 | Turner | 350/356 |
| 4,636,866 A | 1/1987 | Hattori | 358/236 |
| 4,641,193 A | 2/1987 | Glenn | 358/233 |

| | | | |
|---|---|---|---|
| 4,645,881 A | 2/1987 | LeToumelin et al. ........ 379/252 |
| 4,646,158 A | 2/1987 | Ohno et al. ................ 358/236 |
| 4,649,085 A | 3/1987 | Landram .................... 428/620 |
| 4,649,432 A | 3/1987 | Watanabe et al. ........... 358/241 |
| 4,652,932 A | 3/1987 | Miyajima et al. ........... 358/236 |
| 4,655,539 A | 4/1987 | Caulfield et al. ............ 350/3.6 |
| 4,660,938 A | 4/1987 | Kazan ....................... 350/355 |
| 4,661,828 A | 4/1987 | Miller, Jr. et al. .......... 346/108 |
| 4,662,746 A | 5/1987 | Hornbeck ................... 350/269 |
| 4,663,670 A | 5/1987 | Ito et al. .................... 358/245 |
| 4,687,326 A | 8/1987 | Corby, Jr. ....................... 356/5 |
| 4,698,602 A | 10/1987 | Armitage ................. 332/7.51 |
| 4,700,276 A | 10/1987 | Freyman et al. ............ 361/403 |
| 4,707,064 A | 11/1987 | Dobrowolski et al. ... 350/96.19 |
| 4,709,995 A | 12/1987 | Kuribayashi et al. ....... 350/350 |
| 4,710,732 A | 12/1987 | Hornbeck ................. 332/7.51 |
| 4,711,526 A | 12/1987 | Hennings et al. ........... 350/170 |
| 4,714,326 A | 12/1987 | Usui et al. .................. 350/485 |
| 4,717,066 A | 1/1988 | Goldenberg et al. ........ 228/179 |
| 4,719,507 A | 1/1988 | Bos .............................. 358/92 |
| 4,721,629 A | 1/1988 | Sakai et al. .................. 427/35 |
| 4,722,593 A | 2/1988 | Shimazaki .................. 350/336 |
| 4,724,467 A | 2/1988 | Yip et al. ..................... 355/71 |
| 4,728,185 A | 3/1988 | Thomas ..................... 353/122 |
| 4,743,091 A | 5/1988 | Gelbart ....................... 350/252 |
| 4,744,633 A | 5/1988 | Sheiman ..................... 350/132 |
| 4,747,671 A | 5/1988 | Takahashi et al. ........... 350/336 |
| 4,751,509 A | 6/1988 | Kubota et al. ............... 340/784 |
| 4,761,253 A | 8/1988 | Antes ......................... 264/1.3 |
| 4,763,975 A | 8/1988 | Scifres et al. ............ 350/96.15 |
| 4,765,865 A | 8/1988 | Gealer et al. ................ 156/647 |
| 4,772,094 A | 9/1988 | Sheiman ..................... 350/133 |
| 4,797,694 A | 1/1989 | Agostinelli et al. ......... 346/160 |
| 4,797,918 A | 1/1989 | Lee et al. ...................... 380/20 |
| 4,801,194 A | 1/1989 | Agostinelli et al. ......... 350/356 |
| 4,803,560 A | 2/1989 | Matsunaga et al. ......... 359/236 |
| 4,804,641 A | 2/1989 | Arlt et al. .................... 437/227 |
| 4,807,021 A | 2/1989 | Okumura ..................... 357/75 |
| 4,807,965 A | 2/1989 | Garakani ..................... 350/131 |
| 4,809,078 A | 2/1989 | Yabe et al. .................. 358/236 |
| 4,811,082 A | 3/1989 | Jacobs et al. ................. 357/80 |
| 4,811,210 A | 3/1989 | McAulay .................... 364/200 |
| 4,814,759 A | 3/1989 | Gombrich et al. .......... 340/771 |
| 4,817,850 A | 4/1989 | Wiener-Avnear et al. ... 228/119 |
| 4,824,200 A | 4/1989 | Isono et al. .............. 350/96.16 |
| 4,827,391 A | 5/1989 | Sills ............................. 363/41 |
| 4,829,365 A | 5/1989 | Eichenlaub .................... 358/3 |
| 4,836,649 A | 6/1989 | Ledebuhr et al. ........ 350/331 R |
| 4,856,869 A | 8/1989 | Sakata et al. ........... 350/162.18 |
| 4,859,060 A | 8/1989 | Katagiri et al. .............. 356/352 |
| 4,866,488 A | 9/1989 | Frensley ....................... 357/4 |
| 4,882,683 A | 11/1989 | Rupp et al. .................. 364/521 |
| 4,893,509 A | 1/1990 | MacIver et al. ........ 73/517 AV |
| 4,896,948 A | 1/1990 | Dono et al. ................. 350/355 |
| 4,897,708 A | 1/1990 | Clements .................... 357/65 |
| 4,902,083 A | 2/1990 | Wells ........................ 350/6.6 |
| 4,915,463 A | 4/1990 | Barbee, Jr. .................. 350/1.1 |
| 4,915,479 A | 4/1990 | Clarke ......................... 350/345 |
| 4,924,413 A | 5/1990 | Suwannukul ............... 364/521 |
| 4,926,241 A | 5/1990 | Carey ........................... 357/75 |
| 4,930,043 A | 5/1990 | Wiegand ..................... 361/283 |
| 4,934,773 A | 6/1990 | Becker ....................... 350/6.6 |
| 4,940,309 A | 7/1990 | Baum ......................... 350/171 |
| 4,943,815 A | 7/1990 | Aldrich et al. ............. 346/108 |
| 4,945,773 A | 8/1990 | Sickafus ................. 73/862.59 |
| 4,949,148 A | 8/1990 | Bartelink ..................... 357/74 |
| 4,950,890 A | 8/1990 | Gelbart .................. 250/237 G |
| 4,952,925 A | 8/1990 | Haastert ...................... 340/784 |
| 4,954,789 A | 9/1990 | Sampsell .................... 330/4.3 |
| 4,956,619 A | 9/1990 | Hornbeck ................... 330/4.3 |
| 4,961,633 A | 10/1990 | Ibrahim et al. .............. 350/392 |
| 4,970,575 A | 11/1990 | Soga et al. .................... 357/72 |
| 4,978,202 A | 12/1990 | Yang ..................... 350/331 R |
| 4,982,184 A | 1/1991 | Kirkwood ................... 340/783 |
| 4,982,265 A | 1/1991 | Watanabe et al. ............ 357/75 |
| 4,984,824 A | 1/1991 | Antes et al. ................... 283/91 |
| 4,999,308 A | 3/1991 | Nishiura et al. ................ 437/4 |
| 5,003,300 A | 3/1991 | Wells ......................... 340/705 |
| 5,009,473 A | 4/1991 | Hunter et al. ................ 350/6.6 |
| 5,013,141 A | 5/1991 | Sakata ........................ 350/348 |
| 5,018,256 A | 5/1991 | Hornbeck ................. 29/25.01 |
| 5,022,750 A | 6/1991 | Flasck ......................... 353/31 |
| 5,023,905 A | 6/1991 | Wells et al. .................. 379/96 |
| 5,024,494 A | 6/1991 | Williams et al. ............. 350/3.6 |
| 5,028,939 A | 7/1991 | Hornbeck et al. ........... 346/160 |
| 5,031,144 A | 7/1991 | Persky |
| 5,035,473 A | 7/1991 | Kuwayama et al. ......... 350/3.7 |
| 5,037,173 A | 8/1991 | Sampsell et al. ............. 385/17 |
| 5,039,628 A | 8/1991 | Carey ........................ 437/183 |
| 5,040,052 A | 8/1991 | McDavid ..................... 357/80 |
| 5,041,395 A | 8/1991 | Steffen ........................ 437/206 |
| 5,041,851 A | 8/1991 | Nelson ........................ 346/160 |
| 5,043,917 A | 8/1991 | Okamoto .................... 364/518 |
| 5,048,077 A | 9/1991 | Wells et al. .................. 379/96 |
| 5,049,901 A | 9/1991 | Gelbart ....................... 346/108 |
| 5,058,992 A | 10/1991 | Takahashi ................... 359/567 |
| 5,060,058 A | 10/1991 | Goldenberg et al. ........... 358/60 |
| 5,061,049 A | 10/1991 | Hornbeck ................... 359/224 |
| 5,066,614 A | 11/1991 | Dunnaway et al. ......... 437/209 |
| 5,068,205 A | 11/1991 | Baxter et al. ................ 437/205 |
| 5,072,239 A | 12/1991 | Mitcham et al. ........... 346/108 |
| 5,072,418 A | 12/1991 | Boutaud et al. ....... 364/715.06 |
| 5,074,947 A | 12/1991 | Estes et al. .............. 156/307.3 |
| 5,075,940 A | 12/1991 | Kuriyama et al. ......... 29/25.03 |
| 5,079,544 A | 1/1992 | DeMond et al. ............ 340/701 |
| 5,081,617 A | 1/1992 | Gelbart ....................... 369/112 |
| 5,083,857 A | 1/1992 | Hornbeck ................... 359/291 |
| 5,085,497 A | 2/1992 | Um et al. .................... 359/848 |
| 5,089,903 A | 2/1992 | Kuwayama et al. .......... 359/15 |
| 5,093,281 A | 3/1992 | Eshima ....................... 437/217 |
| 5,099,353 A | 3/1992 | Hornbeck ................... 359/291 |
| 5,101,184 A | 3/1992 | Antes .......................... 235/454 |
| 5,101,236 A | 3/1992 | Nelson et al. ............... 355/229 |
| 5,103,334 A | 4/1992 | Swanberg ................... 359/197 |
| 5,105,207 A | 4/1992 | Nelson ........................ 346/160 |
| 5,105,299 A | 4/1992 | Anderson et al. ........... 359/223 |
| 5,105,369 A | 4/1992 | Nelson ........................ 364/525 |
| 5,107,372 A | 4/1992 | Gelbart et al. .............. 359/824 |
| 5,112,436 A | 5/1992 | Bol .............................. 156/643 |
| 5,113,272 A | 5/1992 | Reamey ....................... 359/53 |
| 5,113,285 A | 5/1992 | Franklin et al. ............. 359/465 |
| 5,115,344 A | 5/1992 | Jaskie ......................... 359/573 |
| 5,119,204 A | 6/1992 | Hashimoto et al. ......... 358/254 |
| 5,121,343 A | 6/1992 | Faris .......................... 395/111 |
| 5,126,812 A | 6/1992 | Greiff ........................... 357/25 |
| 5,126,826 A | 6/1992 | Kauchi et al. ................ 357/72 |
| 5,126,836 A | 6/1992 | Um ............................... 358/60 |
| 5,128,660 A | 7/1992 | DeMond et al. ............ 340/707 |
| 5,129,716 A | 7/1992 | Holakovszky et al. ........ 351/50 |
| 5,132,723 A | 7/1992 | Gelbart ......................... 355/40 |
| 5,132,812 A | 7/1992 | Takahashi et al. .............. 359/9 |
| 5,136,695 A | 8/1992 | Goldshlag et al. .......... 395/275 |
| 5,137,836 A | 8/1992 | Lam ............................... 437/8 |
| 5,142,303 A | 8/1992 | Nelson ........................ 346/108 |
| 5,142,405 A | 8/1992 | Hornbeck ................... 359/226 |
| 5,142,677 A | 8/1992 | Ehlig et al. .................. 395/650 |
| 5,144,472 A | 9/1992 | Sang, Jr. et al. ............. 359/254 |
| 5,147,815 A | 9/1992 | Casto ............................ 437/51 |
| 5,148,157 A | 9/1992 | Florence ..................... 340/783 |
| 5,149,405 A | 9/1992 | Bruns et al. .............. 204/129.1 |
| 5,150,205 A | 9/1992 | Um et al. ...................... 358/60 |
| 5,151,718 A | 9/1992 | Nelson ........................ 346/160 |

| Patent | Date | Inventor | Class |
|---|---|---|---|
| 5,151,724 A | 9/1992 | Kikinis | 357/17 |
| 5,151,763 A | 9/1992 | Marek et al. | 357/26 |
| 5,153,770 A | 10/1992 | Harris | 359/245 |
| 5,155,604 A | 10/1992 | Miekka et al. | 359/2 |
| 5,155,615 A | 10/1992 | Tagawa | 359/213 |
| 5,155,812 A | 10/1992 | Ehlig et al. | 395/275 |
| 5,157,304 A | 10/1992 | Kane et al. | 313/495 |
| 5,159,485 A | 10/1992 | Nelson | 359/291 |
| 5,161,042 A | 11/1992 | Hamada | 359/41 |
| 5,162,787 A | 11/1992 | Thompson et al. | 340/794 |
| 5,164,019 A | 11/1992 | Sinton | 136/249 |
| 5,165,013 A | 11/1992 | Faris | 395/104 |
| 5,168,401 A | 12/1992 | Endriz | 359/625 |
| 5,168,406 A | 12/1992 | Nelson | 359/855 |
| 5,170,156 A | 12/1992 | DeMond et al. | 340/794 |
| 5,170,269 A | 12/1992 | Lin et al. | 359/9 |
| 5,170,283 A | 12/1992 | O'Brien et al. | 359/291 |
| 5,172,161 A | 12/1992 | Nelson | 355/200 |
| 5,172,262 A | 12/1992 | Hornbeck | 359/223 |
| 5,177,724 A | 1/1993 | Gelbart | 369/44.16 |
| 5,178,728 A | 1/1993 | Boysel et al. | 156/656 |
| 5,179,274 A | 1/1993 | Sampsell | 250/208.2 |
| 5,179,367 A | 1/1993 | Shimizu | 340/700 |
| 5,181,231 A | 1/1993 | Parikh et al. | 377/26 |
| 5,182,665 A | 1/1993 | O'Callaghan et al. | 359/95 |
| 5,185,823 A | 2/1993 | Kaku et al. | |
| 5,188,280 A | 2/1993 | Nakao et al. | 228/123 |
| 5,189,404 A | 2/1993 | Masimo et al. | 340/720 |
| 5,189,505 A | 2/1993 | Bartelink | 257/419 |
| 5,191,405 A | 3/1993 | Tomita et al. | 227/777 |
| 5,192,864 A | 3/1993 | McEwen et al. | 250/234 |
| 5,192,946 A | 3/1993 | Thompson et al. | 340/794 |
| 5,198,895 A | 3/1993 | Vick | 358/103 |
| 5,202,785 A | 4/1993 | Nelson | 359/214 |
| 5,206,629 A | 4/1993 | DeMond et al. | 340/719 |
| 5,206,829 A | 4/1993 | Thakoor et al. | |
| 5,208,818 A | 5/1993 | Gelbart et al. | 372/30 |
| 5,208,891 A | 5/1993 | Prysner | 385/116 |
| 5,210,637 A | 5/1993 | Puzey | 359/263 |
| 5,212,115 A | 5/1993 | Cho et al. | 437/208 |
| 5,212,555 A | 5/1993 | Stoltz | 358/206 |
| 5,214,308 A | 5/1993 | Nishiguchi et al. | 257/692 |
| 5,214,419 A | 5/1993 | DeMond et al. | 340/794 |
| 5,214,420 A | 5/1993 | Thompson et al. | 340/795 |
| 5,216,278 A | 6/1993 | Lin et al. | |
| 5,216,537 A | 6/1993 | Hornbeck | 359/291 |
| 5,216,544 A | 6/1993 | Horikawa et al. | 359/622 |
| 5,219,794 A | 6/1993 | Satoh et al. | 437/209 |
| 5,220,200 A | 6/1993 | Blanton | 257/778 |
| 5,221,400 A | 6/1993 | Staller et al. | 156/292 |
| 5,221,982 A | 6/1993 | Faris | 359/41 |
| 5,224,088 A | 6/1993 | Atiya | 369/97 |
| 5,226,099 A | 7/1993 | Mignardi et al. | 385/19 |
| 5,229,597 A | 7/1993 | Fukatsu | |
| 5,231,363 A | 7/1993 | Sano et al. | 332/109 |
| 5,231,388 A | 7/1993 | Stoltz | 340/783 |
| 5,231,432 A | 7/1993 | Glenn | 363/31 |
| 5,233,456 A | 8/1993 | Nelson | 359/214 |
| 5,233,460 A | 8/1993 | Partlo et al. | 359/247 |
| 5,233,874 A | 8/1993 | Putty et al. | 73/517 AV |
| 5,237,340 A | 8/1993 | Nelson | 346/108 |
| 5,237,435 A | 8/1993 | Kurematsu et al. | 359/41 |
| 5,239,448 A | 8/1993 | Perkins et al. | 361/764 |
| 5,239,806 A | 8/1993 | Maslakow | 53/432 |
| 5,240,818 A | 8/1993 | Mignardi et al. | 430/321 |
| 5,245,686 A | 9/1993 | Faris et al. | 385/120 |
| 5,247,180 A | 9/1993 | Mitcham et al. | 250/492.1 |
| 5,247,593 A | 9/1993 | Lin et al. | 385/17 |
| 5,249,245 A | 9/1993 | Lebby et al. | 385/89 |
| 5,251,057 A | 10/1993 | Guerin et al. | 359/249 |
| 5,251,058 A | 10/1993 | MacArthur | 359/249 |
| 5,254,980 A | 10/1993 | Hendrix et al. | 345/84 |
| 5,255,100 A | 10/1993 | Urbanus | 358/231 |
| 5,258,325 A | 11/1993 | Spitzer et al. | 437/86 |
| 5,260,718 A | 11/1993 | Rommelmann et al. | 346/107 R |
| 5,260,798 A | 11/1993 | Um et al. | 358/233 |
| 5,262,000 A | 11/1993 | Welbourn et al. | 156/643 |
| 5,272,473 A | 12/1993 | Thompson et al. | 345/7 |
| 5,278,652 A | 1/1994 | Urbanus et al. | 358/160 |
| 5,278,925 A | 1/1994 | Boysel et al. | 385/14 |
| 5,280,277 A | 1/1994 | Hornbeck | 345/108 |
| 5,281,887 A | 1/1994 | Engle | 310/335 |
| 5,281,957 A | 1/1994 | Schoolman | 345/8 |
| 5,285,105 A | 2/1994 | Cain | 257/672 |
| 5,285,196 A | 2/1994 | Gale, Jr. | 345/108 |
| 5,285,407 A | 2/1994 | Gale et al. | 365/189.11 |
| 5,287,096 A | 2/1994 | Thompson et al. | 345/147 |
| 5,287,215 A | 2/1994 | Warde et al. | 359/293 |
| 5,289,172 A | 2/1994 | Gale, Jr. et al. | 345/108 |
| 5,291,317 A | 3/1994 | Newswanger | 359/15 |
| 5,291,473 A | 3/1994 | Pauli | 369/112 |
| 5,293,511 A | 3/1994 | Poradish et al. | 257/434 |
| 5,296,408 A | 3/1994 | Wilbarg et al. | 437/203 |
| 5,296,891 A | 3/1994 | Vogt et al. | 355/67 |
| 5,298,460 A | 3/1994 | Nishiguchi et al. | 437/183 |
| 5,299,037 A | 3/1994 | Sakata | 359/41 |
| 5,299,289 A | 3/1994 | Omae et al. | 359/95 |
| 5,300,813 A | 4/1994 | Joshi et al. | 257/752 |
| 5,301,062 A | 4/1994 | Takahashi et al. | 359/567 |
| 5,303,043 A | 4/1994 | Glenn | 348/40 |
| 5,303,055 A | 4/1994 | Hendrix et al. | 348/761 |
| 5,307,056 A | 4/1994 | Urbanus | 340/189 |
| 5,307,185 A | 4/1994 | Jones et al. | 359/41 |
| 5,310,624 A | 5/1994 | Ehrlich | 430/322 |
| 5,311,349 A | 5/1994 | Anderson et al. | 359/223 |
| 5,311,360 A * | 5/1994 | Bloom et al. | 359/572 |
| 5,312,513 A | 5/1994 | Florence et al. | 156/643 |
| 5,313,479 A | 5/1994 | Florence | 372/26 |
| 5,313,648 A | 5/1994 | Ehlig et al. | 395/800 |
| 5,313,835 A | 5/1994 | Dunn | 73/505 |
| 5,315,418 A | 5/1994 | Sprague et al. | 359/41 |
| 5,315,423 A | 5/1994 | Hong | 359/124 |
| 5,315,429 A | 5/1994 | Abramov | |
| 5,319,214 A | 6/1994 | Gregory et al. | 250/504 R |
| 5,319,668 A | 6/1994 | Luecke | 372/107 |
| 5,319,789 A | 6/1994 | Ehlig et al. | 395/800 |
| 5,319,792 A | 6/1994 | Ehlig et al. | 395/800 |
| 5,320,709 A | 6/1994 | Bowden et al. | |
| 5,321,416 A | 6/1994 | Bassett et al. | 345/8 |
| 5,323,002 A | 6/1994 | Sampsell et al. | 250/252.1 |
| 5,323,051 A | 6/1994 | Adams et al. | 257/417 |
| 5,325,116 A | 6/1994 | Sampsell | 346/108 |
| 5,327,286 A | 7/1994 | Sampsell et al. | 359/561 |
| 5,329,289 A | 7/1994 | Sakamoto et al. | 345/126 |
| 5,330,301 A | 7/1994 | Brancher | 414/417 |
| 5,330,878 A | 7/1994 | Nelson | 430/311 |
| 5,331,454 A | 7/1994 | Hornbeck | 359/224 |
| 5,334,991 A | 8/1994 | Wells et al. | 345/8 |
| 5,339,116 A | 8/1994 | Urbanus et al. | 348/716 |
| 5,339,177 A | 8/1994 | Jenkins et al. | 359/35 |
| 5,340,772 A | 8/1994 | Rosotker | 437/226 |
| 5,347,321 A | 9/1994 | Gove | 348/683 |
| 5,347,378 A | 9/1994 | Handschy et al. | 359/53 |
| 5,347,433 A | 9/1994 | Sedlmayr | 362/32 |
| 5,348,619 A | 9/1994 | Bohannon et al. | 156/664 |
| 5,349,687 A | 9/1994 | Ehlig et al. | 395/800 |
| 5,351,052 A | 9/1994 | D'Hont et al. | 342/42 |
| 5,352,926 A | 10/1994 | Andrews | 257/717 |
| 5,354,416 A | 10/1994 | Okudaira et al. | 156/643 |
| 5,357,369 A | 10/1994 | Pilling et al. | 359/462 |
| 5,357,803 A | 10/1994 | Lane | 73/517 B |
| 5,359,349 A | 10/1994 | Jambor et al. | 345/168 |

| | | | |
|---|---|---|---|
| 5,359,451 A | 10/1994 | Gelbart et al. ............... 359/285 |
| 5,361,131 A | 11/1994 | Tekemori et al. ............ 356/355 |
| 5,365,283 A | 11/1994 | Doherty et al. .............. 348/743 |
| 5,367,585 A | 11/1994 | Ghezzo et al. ................. 385/23 |
| 5,371,543 A | 12/1994 | Anderson .................... 348/270 |
| 5,371,618 A | 12/1994 | Tai et al. ....................... 359/53 |
| 5,382,961 A | 1/1995 | Gale, Jr. ...................... 345/108 |
| 5,387,924 A | 2/1995 | Gale, Jr. et al. ............. 345/108 |
| 5,389,182 A | 2/1995 | Mignardi ..................... 156/344 |
| 5,391,881 A | 2/1995 | Jeuch et al. ............ 250/370.09 |
| 5,392,140 A | 2/1995 | Ezra et al. ..................... 359/41 |
| 5,392,151 A | 2/1995 | Nelson ........................ 359/223 |
| 5,394,303 A | 2/1995 | Yamaji ........................ 361/749 |
| 5,398,071 A | 3/1995 | Gove et al. .................. 348/558 |
| 5,399,898 A | 3/1995 | Rostoker ..................... 257/499 |
| 5,404,365 A | 4/1995 | Hiiro ............................ 372/27 |
| 5,404,485 A | 4/1995 | Ban ............................ 395/425 |
| 5,408,123 A | 4/1995 | Murai .......................... 257/531 |
| 5,410,315 A | 4/1995 | Huber ........................... 342/42 |
| 5,411,769 A | 5/1995 | Hornbeck .................... 427/534 |
| 5,412,186 A | 5/1995 | Gale ............................. 219/679 |
| 5,412,501 A | 5/1995 | Fisli ............................. 359/286 |
| 5,418,584 A | 5/1995 | Larson ........................ 353/122 |
| 5,420,655 A | 5/1995 | Shimizu ........................ 353/33 |
| 5,420,722 A | 5/1995 | Bielak ......................... 359/708 |
| 5,426,072 A | 6/1995 | Finnila ........................ 437/208 |
| 5,427,975 A | 6/1995 | Sparks et al. .................. 437/79 |
| 5,430,524 A | 7/1995 | Nelson ........................ 355/200 |
| 5,435,876 A | 7/1995 | Alfaro et al. ............... 156/247 |
| 5,438,477 A | 8/1995 | Pasch .......................... 361/689 |
| 5,439,731 A | 8/1995 | Li et al. ...................... 428/209 |
| 5,442,411 A | 8/1995 | Urbanus et al. ............ 348/771 |
| 5,442,414 A | 8/1995 | Janssen et al. ................ 353/98 |
| 5,444,566 A | 8/1995 | Gale et al. .................. 359/291 |
| 5,445,559 A | 8/1995 | Gale et al. .................. 451/388 |
| 5,446,479 A | 8/1995 | Thompson et al. ......... 345/139 |
| 5,447,600 A | 9/1995 | Webb ............................. 216/2 |
| 5,448,314 A | 9/1995 | Heimbuch et al. .......... 348/743 |
| 5,448,546 A | 9/1995 | Pauli ........................... 369/112 |
| 5,450,088 A | 9/1995 | Meier et al. .................. 342/51 |
| 5,450,219 A | 9/1995 | Gold et al. ................... 359/40 |
| 5,451,103 A | 9/1995 | Hatanaka et al. ............. 353/31 |
| 5,452,024 A | 9/1995 | Sampsell ..................... 348/755 |
| 5,452,138 A | 9/1995 | Mignardi et al. ........... 359/855 |
| 5,452,437 A | 9/1995 | D'Hont et al. ................ 342/42 |
| 5,453,778 A | 9/1995 | Venkateswar et al. ...... 347/239 |
| 5,453,803 A | 9/1995 | Shapiro et al. ............. 353/119 |
| 5,454,160 A | 10/1995 | Nickel .......................... 29/840 |
| 5,454,906 A | 10/1995 | Baker et al. .................. 216/66 |
| 5,455,445 A | 10/1995 | Kurtz et al. ................. 257/419 |
| 5,455,455 A | 10/1995 | Badehi ........................ 257/690 |
| 5,455,602 A | 10/1995 | Tew ............................. 347/239 |
| 5,457,493 A | 10/1995 | Leddy et al. ................ 348/164 |
| 5,457,566 A | 10/1995 | Sampsell et al. ........... 359/292 |
| 5,457,567 A | 10/1995 | Shinohara ................... 359/305 |
| 5,458,716 A | 10/1995 | Alfaro et al. ............... 156/245 |
| 5,459,492 A | 10/1995 | Venkateswar ............... 347/253 |
| 5,459,528 A | 10/1995 | Pettitt ......................... 348/568 |
| 5,459,592 A | 10/1995 | Shibatani et al. ............. 359/40 |
| 5,461,197 A | 10/1995 | Hiruta et al. .............. 174/52.4 |
| 5,461,410 A | 10/1995 | Venkateswar et al. ...... 347/240 |
| 5,461,411 A | 10/1995 | Florence et al. ............ 347/240 |
| 5,461,547 A | 10/1995 | Ciupke et al. ................ 362/31 |
| 5,463,347 A | 10/1995 | Jones et al. ................. 330/253 |
| 5,463,497 A | 10/1995 | Muraki et al. .............. 359/618 |
| 5,465,175 A | 11/1995 | Woodgate et al. .......... 359/463 |
| 5,467,106 A | 11/1995 | Salomon ....................... 345/87 |
| 5,467,138 A | 11/1995 | Gove ........................... 348/452 |
| 5,467,146 A | 11/1995 | Huang et al. ............... 348/743 |
| 5,469,302 A | 11/1995 | Lim ............................. 359/846 |
| 5,471,341 A | 11/1995 | Warde et al. ................ 359/293 |
| 5,473,512 A | 12/1995 | Degani et al. ............... 361/760 |
| 5,475,236 A | 12/1995 | Yoshizaki ...................... 257/48 |
| 5,480,839 A | 1/1996 | Ezawa et al. ................ 437/209 |
| 5,481,118 A | 1/1996 | Tew ............................. 250/551 |
| 5,481,133 A | 1/1996 | Hsu ............................. 257/621 |
| 5,482,564 A | 1/1996 | Douglas et al. ............... 134/18 |
| 5,482,818 A | 1/1996 | Nelson ........................ 430/394 |
| 5,483,307 A | 1/1996 | Anderson ..................... 353/98 |
| 5,485,172 A | 1/1996 | Sawachika et al. ............ 345/8 |
| 5,485,304 A | 1/1996 | Kaeriyama .................. 359/291 |
| 5,485,354 A | 1/1996 | Ciupke et al. ................ 362/31 |
| 5,486,698 A | 1/1996 | Hanson et al. .............. 250/332 |
| 5,486,841 A | 1/1996 | Hara et al. ...................... 345/8 |
| 5,486,946 A | 1/1996 | Jachimowicz et al. ...... 359/263 |
| 5,488,431 A | 1/1996 | Gove et al. .................. 348/716 |
| 5,489,952 A | 2/1996 | Gove et al. .................. 348/771 |
| 5,490,009 A | 2/1996 | Venkateswar et al. ...... 359/291 |
| 5,491,510 A | 2/1996 | Gove ............................ 348/77 |
| 5,491,612 A | 2/1996 | Nicewarner, Jr. ............ 361/760 |
| 5,491,715 A | 2/1996 | Flaxl ........................... 375/344 |
| 5,493,177 A | 2/1996 | Muller et al. ................ 313/578 |
| 5,493,439 A | 2/1996 | Engle ........................... 359/292 |
| 5,497,172 A | 3/1996 | Doherty et al. ............... 345/85 |
| 5,497,197 A | 3/1996 | Gove et al. .................. 348/388 |
| 5,497,262 A | 3/1996 | Kaeriyama .................. 359/223 |
| 5,499,060 A | 3/1996 | Gove et al. .................. 348/651 |
| 5,499,062 A | 3/1996 | Urbanus ...................... 348/771 |
| 5,500,761 A | 3/1996 | Goossen et al. ............. 359/290 |
| 5,502,481 A | 3/1996 | Dentinger et al. ............ 348/51 |
| 5,504,504 A | 4/1996 | Markandey et al. ......... 345/214 |
| 5,504,514 A | 4/1996 | Nelson ........................ 347/130 |
| 5,504,575 A | 4/1996 | Stafford ...................... 356/330 |
| 5,504,614 A | 4/1996 | Webb et al. ................. 359/223 |
| 5,506,171 A | 4/1996 | Leonard et al. ............. 437/187 |
| 5,506,597 A | 4/1996 | Thompson et al. ........... 345/85 |
| 5,506,720 A | 4/1996 | Yoon ........................... 359/224 |
| 5,508,558 A | 4/1996 | Robinette, Jr. et al. ...... 257/700 |
| 5,508,561 A | 4/1996 | Tago et al. .................. 257/737 |
| 5,508,565 A | 4/1996 | Hatakeyama et al. ....... 257/777 |
| 5,508,750 A | 4/1996 | Hewlett et al. .............. 348/558 |
| 5,508,841 A | 4/1996 | Lin et al. .................... 359/318 |
| 5,510,758 A | 4/1996 | Fujita et al. ................. 333/247 |
| 5,510,824 A | 4/1996 | Nelson ........................ 347/239 |
| 5,512,374 A | 4/1996 | Wallace et al. ............. 428/422 |
| 5,512,748 A | 4/1996 | Hanson ....................... 250/332 |
| 5,515,076 A | 5/1996 | Thompson et al. ......... 345/139 |
| 5,516,125 A | 5/1996 | McKenna ...................... 279/3 |
| 5,517,340 A | 5/1996 | Doany et al. .................. 359/41 |
| 5,517,347 A | 5/1996 | Sampsell ..................... 359/224 |
| 5,517,357 A | 5/1996 | Shibayama .................. 359/547 |
| 5,517,359 A | 5/1996 | Gelbart ........................ 359/623 |
| 5,519,251 A | 5/1996 | Sato et al. ................... 257/666 |
| 5,519,450 A | 5/1996 | Urbanus et al. ............ 348/600 |
| 5,521,748 A | 5/1996 | Sarraf ......................... 359/321 |
| 5,523,619 A | 6/1996 | McAllister et al. ......... 257/686 |
| 5,523,628 A | 6/1996 | Williams et al. ............ 257/777 |
| 5,523,803 A | 6/1996 | Urbanus et al. ............ 348/771 |
| 5,523,878 A | 6/1996 | Wallace et al. ............. 359/290 |
| 5,523,881 A | 6/1996 | Florence et al. ............ 359/561 |
| 5,523,920 A | 6/1996 | Machuga et al. ............ 381/767 |
| 5,524,155 A | 6/1996 | Weaver ......................... 385/24 |
| 5,534,107 A | 7/1996 | Gray et al. ............... 156/643.1 |
| 5,534,883 A | 7/1996 | Koh .............................. 345/3 |
| 5,539,422 A | 7/1996 | Heacock et al. ................ 345/8 |
| 5,544,306 A | 8/1996 | Deering et al. ............. 395/164 |
| 5,552,635 A | 9/1996 | Kim et al. |
| 5,554,304 A | 9/1996 | Suzuki .......................... 216/2 |
| 5,576,878 A | 11/1996 | Henck ......................... 359/224 |
| 5,602,671 A | 2/1997 | Hornbeck .................... 359/224 |
| 5,606,181 A | 2/1997 | Sakuma et al. ................ 257/88 |
| 5,606,447 A | 2/1997 | Asada et al. ................. 359/199 |

| | | | |
|---|---|---|---|
| 5,610,438 A | 3/1997 | Wallace et al. ............... 257/682 |
| 5,623,361 A | 4/1997 | Engle .......................... 359/291 |
| 5,629,566 A | 5/1997 | Doi et al. ................... 257/789 |
| 5,629,801 A | 5/1997 | Staker et al. ............... 359/572 |
| 5,640,216 A | 6/1997 | Hasegawa et al. ............ 349/58 |
| 5,658,698 A | 8/1997 | Yagi et al. .................... 430/11 |
| 5,661,593 A | 8/1997 | Engle .......................... 359/292 |
| 5,663,817 A | 9/1997 | Frapin et al. .................. 349/5 |
| 5,668,611 A | 9/1997 | Ernstoff et al. ............. 348/771 |
| 5,673,139 A | 9/1997 | Johnson ..................... 359/291 |
| 5,677,783 A | 10/1997 | Bloom et al. ............... 359/224 |
| 5,689,361 A | 11/1997 | Damen et al. ............... 359/284 |
| 5,691,836 A | 11/1997 | Clark .......................... 359/247 |
| 5,694,740 A | 12/1997 | Martin et al. ................. 53/431 |
| 5,696,560 A | 12/1997 | Songer ........................ 348/436 |
| 5,699,740 A | 12/1997 | Gelbart ........................ 101/477 |
| 5,704,700 A | 1/1998 | Kappel et al. .................. 353/31 |
| 5,707,160 A | 1/1998 | Bowen ........................ 400/472 |
| 5,712,649 A | 1/1998 | Tosaki ............................ 345/8 |
| 5,713,652 A | 2/1998 | Zavracky et al. ............ 353/122 |
| 5,726,480 A | 3/1998 | Pister .......................... 257/415 |
| 5,731,802 A | 3/1998 | Aras et al. ................... 345/148 |
| 5,734,224 A | 3/1998 | Tagawa et al. ............... 313/493 |
| 5,742,373 A | 4/1998 | Alvelda ....................... 349/204 |
| 5,744,752 A | 4/1998 | McHerron et al. ......... 174/52.4 |
| 5,745,271 A | 4/1998 | Ford et al. ................... 359/130 |
| 5,757,354 A | 5/1998 | Kawamura .................. 345/126 |
| 5,764,280 A | 6/1998 | Bloom et al. ................. 348/53 |
| 5,768,009 A | 6/1998 | Little .......................... 359/293 |
| 5,770,473 A | 6/1998 | Hall et al. .................... 438/26 |
| 5,793,519 A | 8/1998 | Furlani et al. ................ 359/291 |
| 5,798,743 A | 8/1998 | Bloom ........................... 345/90 |
| 5,798,805 A | 8/1998 | Ooi et al. ...................... 349/10 |
| 5,801,074 A | 9/1998 | Kim et al. ................... 438/125 |
| 5,802,222 A | 9/1998 | Rasch et al. ..................... 385/1 |
| 5,808,323 A | 9/1998 | Spaeth et al. ................. 257/88 |
| 5,815,126 A | 9/1998 | Fan et al. ......................... 345/8 |
| 5,825,443 A | 10/1998 | Kawasaki et al. ............. 349/95 |
| 5,832,148 A | 11/1998 | Yariv |
| 5,835,255 A | 11/1998 | Miles .......................... 359/291 |
| 5,835,256 A | 11/1998 | Huibers ....................... 359/291 |
| 5,837,562 A | 11/1998 | Cho .............................. 438/51 |
| 5,841,929 A | 11/1998 | Komatsu et al. |
| 5,844,711 A | 12/1998 | Long, Jr. |
| 5,847,859 A | 12/1998 | Murata ....................... 359/201 |
| 5,862,164 A | 1/1999 | Hill ............................... 372/27 |
| 5,868,854 A | 2/1999 | Kojima et al. ............... 134/1.3 |
| 5,886,675 A | 3/1999 | Aye et al. ........................ 347/7 |
| 5,892,505 A | 4/1999 | Tropper ....................... 345/208 |
| 5,895,233 A | 4/1999 | Higashi et al. ............... 438/107 |
| 5,898,515 A | 4/1999 | Furlani et al. ................ 359/291 |
| 5,903,243 A | 5/1999 | Jones ............................... 345/7 |
| 5,903,395 A | 5/1999 | Rallison et al. .............. 359/630 |
| 5,910,856 A | 6/1999 | Ghosh et al. ................. 359/291 |
| 5,912,094 A | 6/1999 | Aksyuk et al. .................. 430/5 |
| 5,912,608 A | 6/1999 | Asada ......................... 335/222 |
| 5,914,801 A | 6/1999 | Dhuler et al. ................ 359/230 |
| 5,915,168 A | 6/1999 | Salatino et al. .............. 438/110 |
| 5,919,548 A | 7/1999 | Barron et al. ................ 428/138 |
| 5,920,411 A | 7/1999 | Duck et al. ................... 359/127 |
| 5,920,418 A | 7/1999 | Shiono et al. ................ 359/246 |
| 5,923,475 A | 7/1999 | Kurtz et al. .................. 359/619 |
| 5,926,309 A | 7/1999 | Little .......................... 359/293 |
| 5,926,318 A | 7/1999 | Hebert ........................ 359/618 |
| 5,942,791 A | 8/1999 | Shorrocks et al. ........... 257/522 |
| 5,949,390 A | 9/1999 | Nomura et al. ............... 345/32 |
| 5,949,570 A | 9/1999 | Shiono et al. ................ 359/291 |
| 5,953,161 A | 9/1999 | Troxell et al. ............... 359/618 |
| 5,955,771 A | 9/1999 | Kurtz et al. .................. 257/419 |
| 5,963,788 A | 10/1999 | Barron et al. ................. 438/48 |
| 5,978,127 A | 11/1999 | Berg ........................... 359/279 |
| 5,982,553 A | 11/1999 | Bloom et al. ................ 359/627 |
| 5,986,634 A | 11/1999 | Alioshin et al. ............. 345/126 |
| 5,986,796 A | 11/1999 | Miles .......................... 359/260 |
| 6,004,912 A | 12/1999 | Gudeman ..................... 508/577 |
| 6,012,336 A | 1/2000 | Eaton et al. |
| 6,016,222 A | 1/2000 | Setani et al. ................. 359/571 |
| 6,025,859 A | 2/2000 | Ide et al. ..................... 347/135 |
| 6,038,057 A | 3/2000 | Brazas, Jr. et al. .......... 359/291 |
| 6,040,748 A | 3/2000 | Gueissaz ....................... 335/78 |
| 6,046,840 A | 4/2000 | Huibers ....................... 359/291 |
| 6,055,090 A | 4/2000 | Miles .......................... 359/291 |
| 6,057,520 A | 5/2000 | Goodwin-Johansson .... 200/181 |
| 6,061,166 A | 5/2000 | Furlani et al. ................ 359/254 |
| 6,061,489 A | 5/2000 | Ezra et al. ................... 385/115 |
| 6,062,461 A | 5/2000 | Sparks et al. ............. 228/123.1 |
| 6,064,404 A | 5/2000 | Aras et al. ................... 345/507 |
| 6,069,392 A | 5/2000 | Tai et al. ..................... 257/419 |
| 6,075,632 A | 6/2000 | Braun ......................... 359/124 |
| 6,084,626 A | 7/2000 | Ramanujan et al. ......... 347/239 |
| 6,088,102 A | 7/2000 | Manhart ..................... 356/354 |
| 6,090,717 A | 7/2000 | Powell et al. ................ 438/710 |
| 6,091,521 A | 7/2000 | Popovich ...................... 359/15 |
| 6,096,576 A | 8/2000 | Corbin et al. ................ 438/108 |
| 6,096,656 A | 8/2000 | Matzke et al. |
| 6,097,352 A | 8/2000 | Zavracky et al. ............... 345/7 |
| 6,101,036 A | 8/2000 | Bloom ........................ 359/567 |
| 6,115,168 A | 9/2000 | Zhao et al. .................. 359/247 |
| 6,123,985 A | 9/2000 | Robinson et al. ............ 427/162 |
| 6,124,145 A | 9/2000 | Stemme et al. ................ 438/26 |
| 6,130,770 A | 10/2000 | Bloom ........................ 359/224 |
| 6,144,481 A | 11/2000 | Kowarz et al. .............. 359/291 |
| 6,147,789 A | 11/2000 | Gelbart ....................... 359/231 |
| 6,154,259 A | 11/2000 | Hargis et al. ................ 348/756 |
| 6,154,305 A | 11/2000 | Dickensheets et al. |
| 6,163,026 A | 12/2000 | Bawolek et al. ............. 250/351 |
| 6,163,402 A | 12/2000 | Chou et al. .................. 359/443 |
| 6,172,796 B1 | 1/2001 | Kowarz et al. .............. 359/290 |
| 6,172,797 B1 | 1/2001 | Huibers ....................... 359/291 |
| 6,177,980 B1 | 1/2001 | Johnson ......................... 355/67 |
| 6,181,458 B1 | 1/2001 | Brazas, Jr. et al. .......... 359/290 |
| 6,188,519 B1 | 2/2001 | Johnson ...................... 369/572 |
| 6,195,196 B1 | 2/2001 | Kimura et al. ............... 359/295 |
| 6,197,610 B1 | 3/2001 | Toda ............................. 438/50 |
| 6,210,988 B1 | 4/2001 | Howe et al. ................... 438/50 |
| 6,219,015 B1 | 4/2001 | Bloom et al. .................. 345/87 |
| 6,222,954 B1 | 4/2001 | Riza ............................. 385/18 |
| 6,229,650 B1 | 5/2001 | Reznichenko et al. ...... 359/566 |
| 6,229,683 B1 | 5/2001 | Goodwin-Johansson .... 361/233 |
| 6,241,143 B1 | 6/2001 | Kuroda ..................... 228/110.1 |
| 6,249,381 B1 | 6/2001 | Suganuma |
| 6,251,842 B1 | 6/2001 | Gudeman ..................... 508/577 |
| 6,254,792 B1 | 7/2001 | Van Buskirk et al. ......... 216/13 |
| 6,261,494 B1 | 7/2001 | Zavracky et al. ............ 264/104 |
| 6,271,145 B1 | 8/2001 | Toda ........................... 438/706 |
| 6,271,808 B1 | 8/2001 | Corbin ........................... 345/7 |
| 6,274,469 B1 | 8/2001 | Yu .............................. 438/592 |
| 6,282,213 B1 * | 8/2001 | Gutin et al. ................... 372/20 |
| 6,290,859 B1 | 9/2001 | Fleming et al. ................ 216/2 |
| 6,290,864 B1 | 9/2001 | Patel et al. ..................... 216/79 |
| 6,300,148 B1 | 10/2001 | Birdsley et al. ................ 438/15 |
| 6,303,986 B1 | 10/2001 | Shook ......................... 257/680 |
| 6,310,018 B1 | 10/2001 | Behr et al. ................... 510/175 |
| 6,313,901 B1 | 11/2001 | Cacharelis |
| 6,314,210 B1 * | 11/2001 | Fukushima et al. ......... 382/280 |
| 6,323,984 B1 | 11/2001 | Trisnadi ...................... 359/245 |
| 6,324,193 B1 * | 11/2001 | Bourzeix et al. ............. 372/20 |
| 6,342,960 B1 | 1/2002 | McCullough ............... 359/124 |
| 6,346,430 B1 | 2/2002 | Raj et al. |
| 6,356,577 B1 | 3/2002 | Miller ......................... 372/107 |
| 6,356,689 B1 | 3/2002 | Greywall ...................... 385/52 |
| 6,359,333 B1 | 3/2002 | Wood et al. ................. 257/704 |

| | | | |
|---|---|---|---|
| 6,384,959 B1 | 5/2002 | Furlani et al. | 359/291 |
| 6,387,723 B1 | 5/2002 | Payne et al. | 438/48 |
| 6,392,309 B1 | 5/2002 | Wataya et al. | 257/796 |
| 6,418,152 B1 * | 7/2002 | Davis | 372/18 |
| 6,421,179 B1 | 7/2002 | Gutin et al. | 359/572 |
| 6,438,954 B1 | 8/2002 | Goetz et al. | |
| 6,445,470 B1 * | 9/2002 | Jenkins et al. | 359/11 |
| 6,452,260 B1 | 9/2002 | Corbin et al. | 257/686 |
| 6,479,811 B1 * | 11/2002 | Kruschwitz et al. | 250/237 G |
| 6,480,634 B1 * | 11/2002 | Corrigan | 385/4 |
| 6,497,490 B1 | 12/2002 | Miller et al. | 359/614 |
| 6,525,863 B1 | 2/2003 | Riza | 359/290 |
| 6,563,974 B2 | 5/2003 | Agha Riza | 385/18 |
| 6,569,717 B1 | 5/2003 | Murade | |
| 2001/0019454 A1 | 9/2001 | Tadic-Galeb et al. | 359/649 |
| 2002/0112746 A1 | 8/2002 | DeYoung et al. | 134/36 |
| 2002/0131228 A1 | 9/2002 | Potter | |
| 2002/0131230 A1 | 9/2002 | Potter | 361/277 |
| 2002/0135708 A1 | 9/2002 | Murden et al. | |
| 2002/0176151 A1 * | 11/2002 | Moon et al. | 359/298 |
| 2002/0195418 A1 | 12/2002 | Kowarz et al. | |
| 2002/0196492 A1 | 12/2002 | Trisnadi et al. | |
| 2003/0056078 A1 | 3/2003 | Johansson et al. | |

* cited by examiner

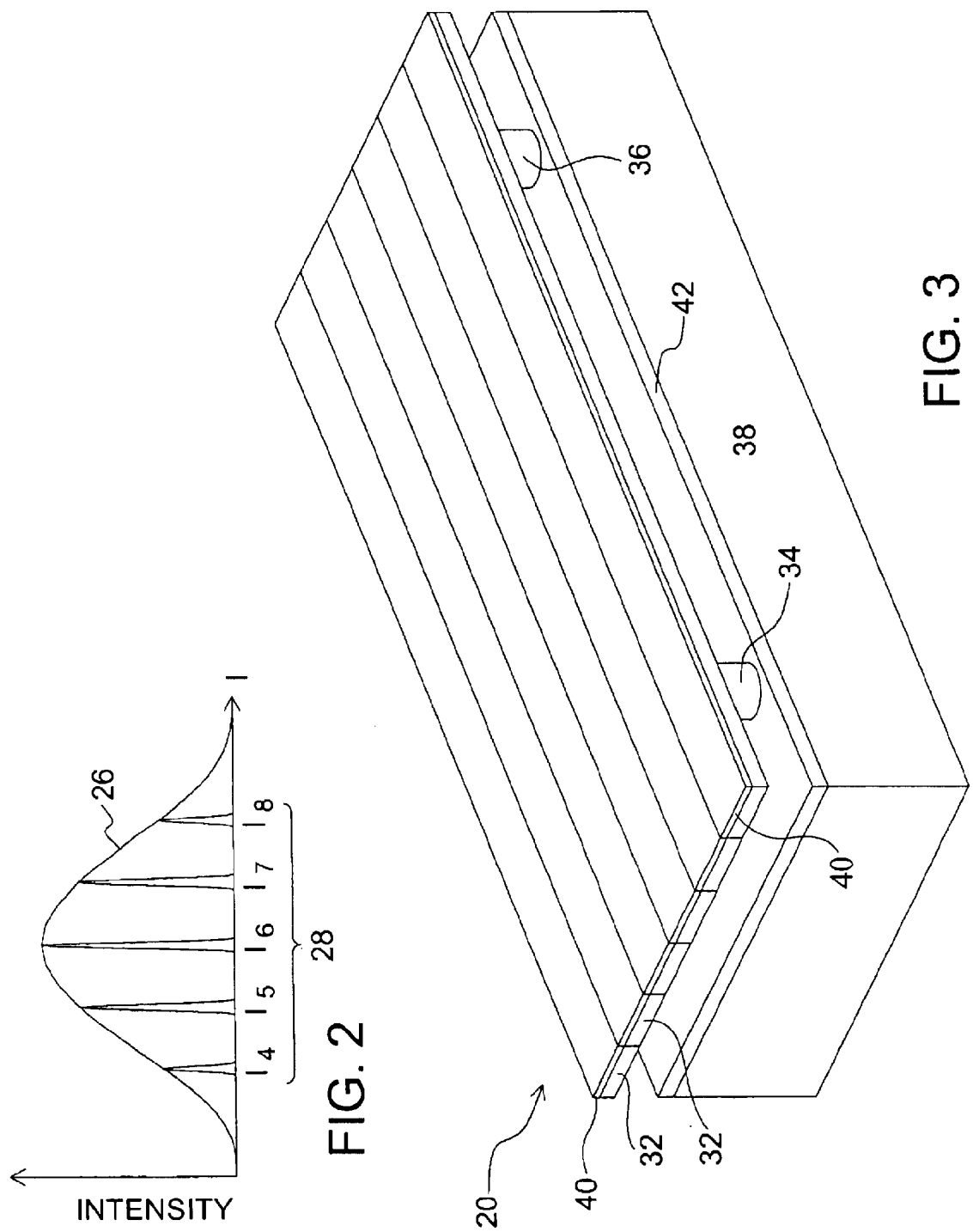

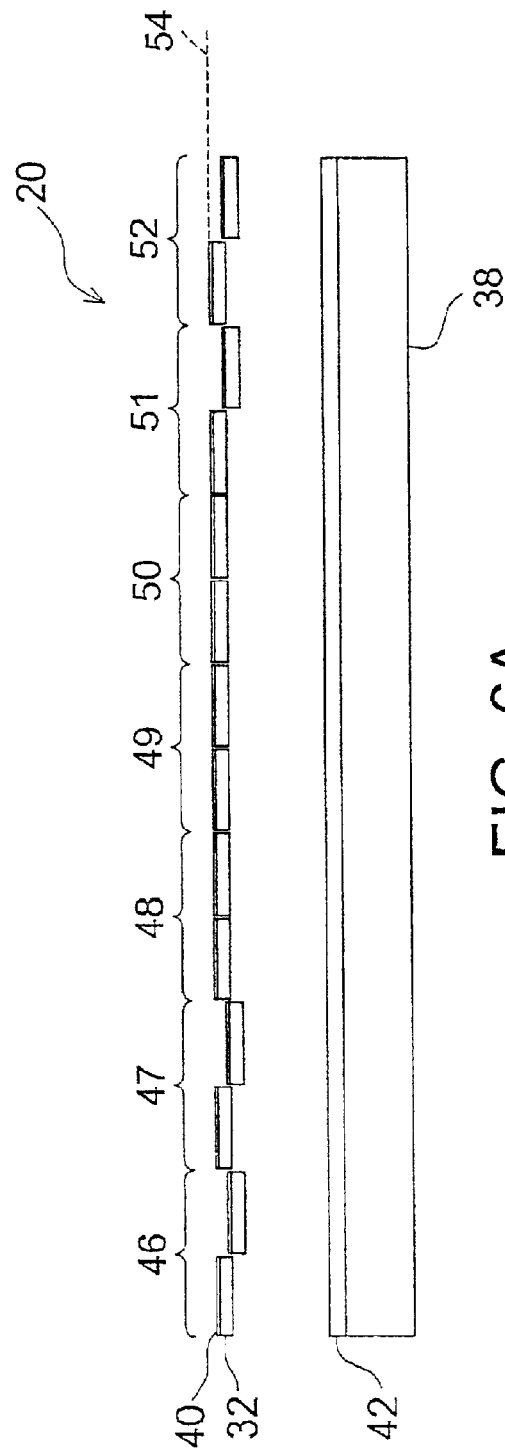
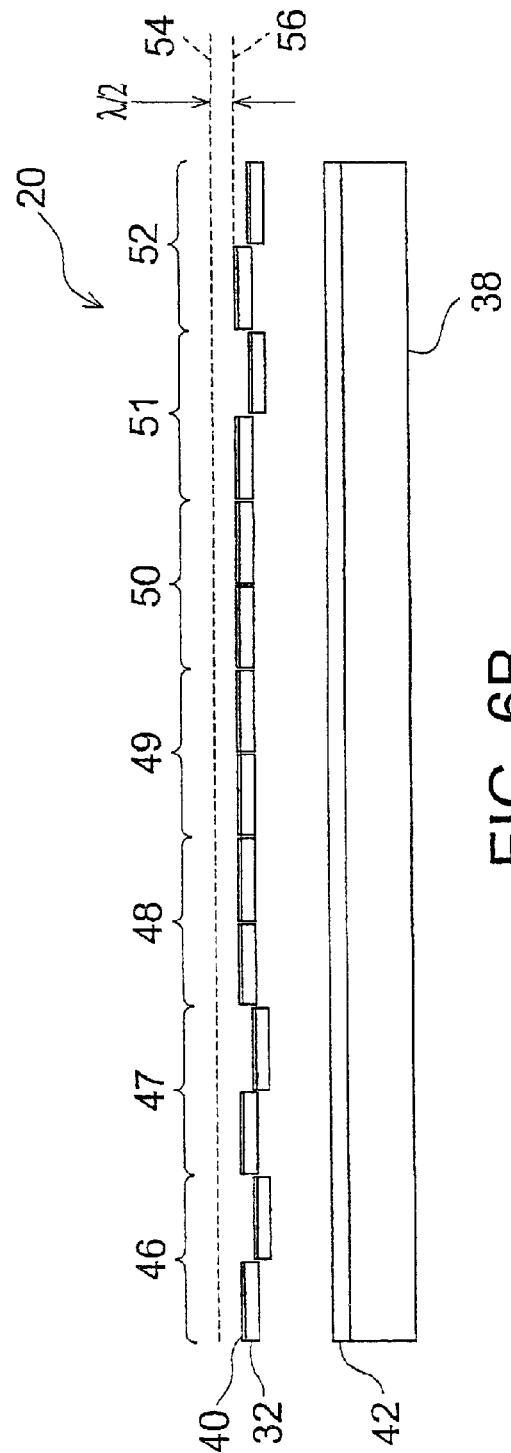
FIG. 6A
FIG. 6B

RAPIDLY TUNABLE EXTERNAL CAVITY LASER

FIELD OF THE INVENTION

This invention relates to the field of lasers. More particularly, this invention relates to the field of lasers where an external cavity provides laser tuning.

BACKGROUND OF THE INVENTION

In WDM (wavelength division multiplexing) optical communication, multiple wavelengths of light each carry a communication signal within a single optical fiber. Each of the multiple wavelengths of light is provided by an individual laser. In general, each wavelength is provided by an individual laser specifically designed to provide a specific wavelength. These individual lasers do not include a tuning capability. In other words, these individual lasers provide the specific wavelength for which they are designed and only the specific wavelength. This means that tens or possibly hundreds of different individually designed and fabricated lasers are required to build a WDM system that includes tens or hundreds of channels. In some WDM applications, it would be highly desirable to have a tunable laser that could be tuned to a specific wavelength. Such a tunable laser could be used as a replacement for the tens or hundreds of individually designed and fabricated lasers required to build the WDM system that includes the tens or hundreds of channels.

In U.S. Pat. No. 5,230,005, Rubino et al. teach a laser which includes a resonant cavity formed by an end mirror and a reflecting mirror. A spatial light modulator placed near the reflecting mirror allows a lasing wavelength to travel through the resonant cavity while blocking other wavelengths. A first problem associated with the laser taught by Rubino et al. is that the end mirror and the reflecting mirror provide a fixed length resonant cavity. As such, only lasing wavelengths which meet a resonant condition for the fixed length resonant cavity will lase. Thus, the laser taught by Rubino et al. is not continuously tunable. Rather it is only tunable in discrete steps. A second problem associated with the laser taught by Rubino et al. is that the spatial light modulator selectively allows the lasing wavelength to transmit through the spatial light modulator, reflect from the reflecting mirror, and return through the spatial light modulator. As the lasing wavelength transmits through the spatial light modulator, the lasing wavelength forms a focus at the plane of the spatial light modulator. On the return through the spatial light modulator, the lasing wavelength has a spot size due to the round trip between the spatial light modulator and the reflecting mirror. Accordingly, only a portion of the lasing wavelength is expected to pass through the spatial light modulator on the return through the spatial light modulator. Thus, the laser taught by Rubino et al. is expected to be inefficient due to the loss of light on the return through the spatial light modulator.

In an article entitled, "Spectrally narrow pulsed dye laser without beam expander," in Applied Optics, Vol. 17, No. 14, Jul. 15. 1978, Littman and Metcalf teach an external cavity laser in what has come to be known as a Littman-Metcalf external cavity laser. The Littman-Metcalf external cavity laser includes a partially reflecting mirror, a dye lasing medium, a diffraction grating, and a rotatable mirror. The partially reflecting mirror and the rotatable mirror form a resonant cavity. The dye lasing medium outputs multiple light wavelengths which are reflected by the diffraction grating to the rotatable mirror. By rotating the rotatable mirror to return a particular light wavelength to the dye lasing medium, a lasing wavelength is chosen.

In U.S. Pat. No. 5,319,668, Luecke teaches a modified Littman-Metcalf external cavity laser where the dye lasing medium is replaced by a laser diode and where the pivot point for the rotatable mirror is selected to provide a continuous tuning capability. However, because the modified Littman-Metcalf external cavity laser taught by Luecke is accomplished by mechanically rotating a mirror, the modified Littman-Metcalf external cavity laser provides a slow tuning speed. It is believed that for the modified Littman-Metcalf external cavity laser taught by Luecke, the tuning speed is on the order of 1 sec.

It is believed that there are MEMS based Littman-Metcalf external cavity lasers currently under development that include the rotatable mirror originally taught by Littman and Metcalf. However, it is believed that these MEMS based Littman-Metcalf external cavity lasers, while providing a faster tuning speed than 1 sec., do not provide an adequate tuning speed for WDM applications. It is believed that tuning speeds for the MEMS based Littman-Metcalf external cavity lasers are on an order of 10 μsec.

What is needed is a continuously tunable laser source, which is efficient, which provides a fast tuning speed, and which is economical.

SUMMARY OF THE INVENTION

An external cavity laser of the present invention comprises a laser source, a collimation optical element, a blazed diffraction grating, a transform optical element, and a light modulator. The laser source is operable to produce a light output comprising a range of light wavelengths. The collimation optical element couples the laser source to the blazed diffraction grating. The collimation optical element collimates the light output. The blazed diffraction grating diffracts the light output into a first diffraction order. The transform optical element couples the blazed diffraction grating to the light modulator, which is located in a transform plane of the transform optical element. The transform optical element converts the first diffraction order to position in the transform plane by focusing the range of light wavelengths to the transform plane.

The light modulator comprises an array of light modulating pixels selectively operable in first and second modes. A particular light modulating pixel in the first mode reflects light along a return path. The particular light modulating pixel in the second mode directs light away from the return path. The first mode is selectively operable to adjust a return path length by at least a half wavelength. In operation at least one of the light modulating pixels operates in the first mode returning a lasing wavelength along the return path and creating a resonant cavity for the lasing wavelength while operating a remainder of the light modulating pixels in the second mode to direct a remainder of the range of light wavelengths away from the return path.

BRIEF DESCRIPTION OF THE DRAWINGS

FIG. 2 illustrates a gain curve of a laser source of the present invention.

FIG. 3 illustrates a grating light valve™ light modulator of the preferred external cavity laser of the present invention.

FIGS. 6A and 6B illustrate multiple pixels of the grating light valve™ light modulator of the preferred external cavity laser of the present invention where a particular pixel is in the reflection mode and where a height of elongated elements of the particular pixel adjusts a return path length of the preferred external cavity laser.

DETAILED DESCRIPTION OF THE EMBODIMENTS

Figure 1:
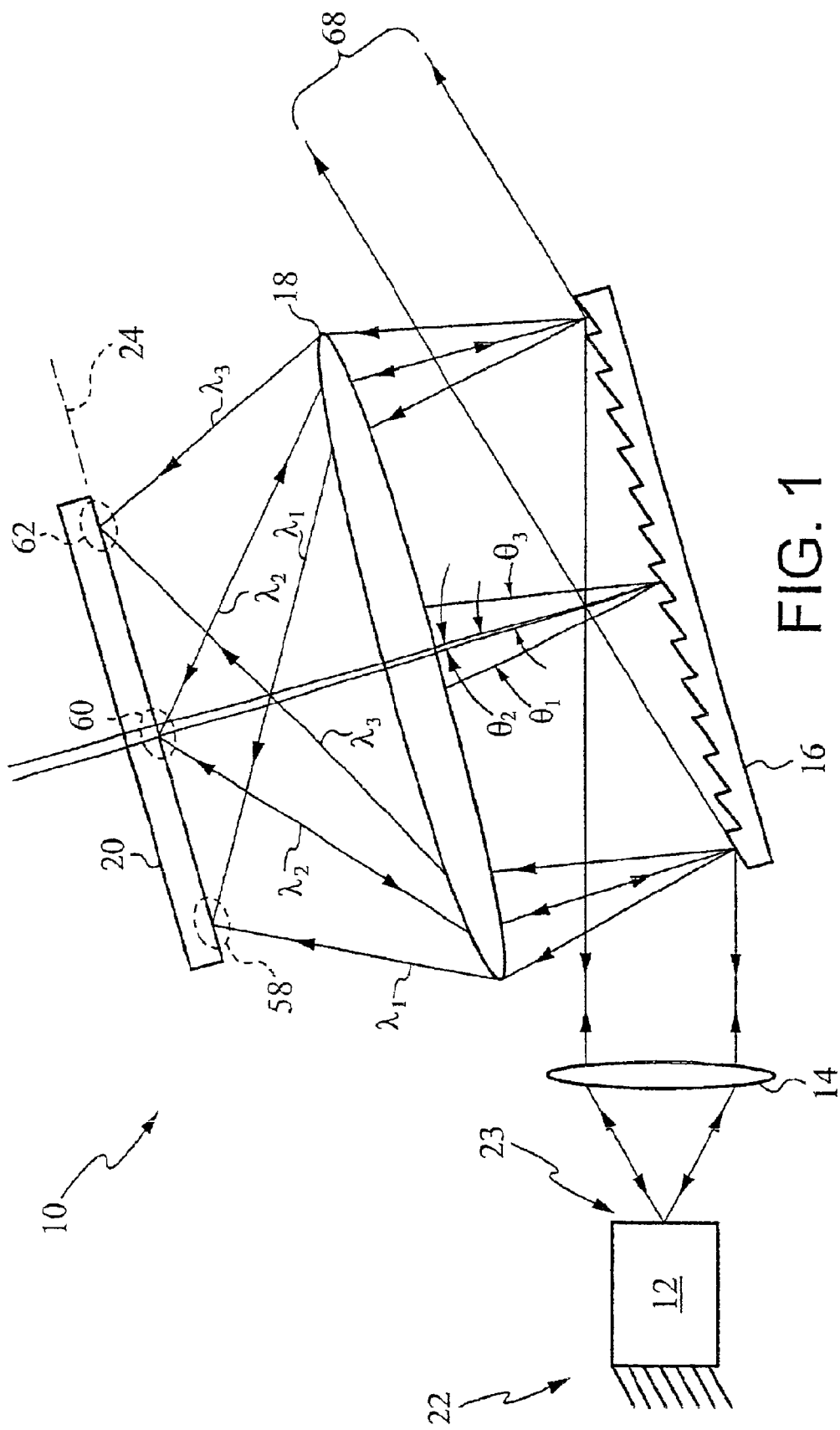
FIG. 1 illustrates the preferred external cavity laser of the present invention.

The preferred external cavity laser of the present invention is illustrated in FIG. 1. The preferred external cavity laser 10 comprises a laser source 12, a collimation lens 14, a blazed diffraction grating 16, a transform lens 18, and a grating light valve™ light modulator 20. The laser source 12 is optically coupled to the blazed diffraction grating 16 via the collimation lens 14. The blazed diffraction grating 16 is optically coupled to the grating light valve™ light modulator 20 via the transform lens 18.

The laser source 12 of the present invention is operable to produce a range of lasing wavelengths over a laser source gain curve. The laser source gain curve and the range of lasing wavelengths are graphically illustrated in FIG. 2, where an x-axis is wavelength λ and a y-axis is power. The laser source gain curve 26 is a function of a lasing material which makes up the laser source 12. Preferably, the laser source 12 comprises a laser diode. More preferably, the laser source 12 comprises an InGaAsP laser diode. Most preferably, the laser source 12 comprises the InGaAsP laser diode comprising a gain band over a wavelength range of from 1,525 to 1,575 nm. Preferably, a first side 22 of the laser source 12 comprises a high reflectance mirror. Preferably, a second side of the laser source 12 comprises an anti-reflective coating.

Preferably, the collimation lens 14 of the present invention comprises a 0.25 mm focal length lens, which is optimized for the InGaAsP laser diode comprising the gain band over the wavelength range of from 1,525 to 1,575 nm. Alternatively, the collimation lens 14 comprises a different lens appropriately selected for the laser source 12. Preferably, the blazed diffraction grating 16 of the present invention comprises a pitch of 1,100 grooves/mm. Alternatively, the blazed diffraction grating 16 comprises a different blazed diffraction grating appropriately selected for the laser source 12 and the collimation lens 14. Preferably, the transform lens 18 of the present invention comprises a 0.23 mm focal length lens. Alternatively, the transform lens 18 comprises a different transform lens appropriately selected for the laser source 12.

The grating light valve™ light modulator of the present invention is illustrated in FIG. 3. The grating light valve™ light modulator 20 preferably comprises elongated elements 32 suspended by first and second posts, 34 and 36, above a substrate 38. The elongated elements 32 comprise a conducting and reflecting surface 40. The substrate 38 comprises a conductor 42. In operation, the grating light valve™ light modulator 20 operates to produce modulated light selected from a reflection mode and a diffraction mode.

It will be readily apparent to one skilled in the art that the conducting and reflecting surface 40 can be replaced by a multilayer dielectric reflector and a conducting element where the conducting element is buried within each of the elongated elements 32. Further, it will be readily apparent to one skilled in the art that the conducting and reflecting surface 40 can be coated with a transparent layer such as an anti-reflective layer.

Figure 4:
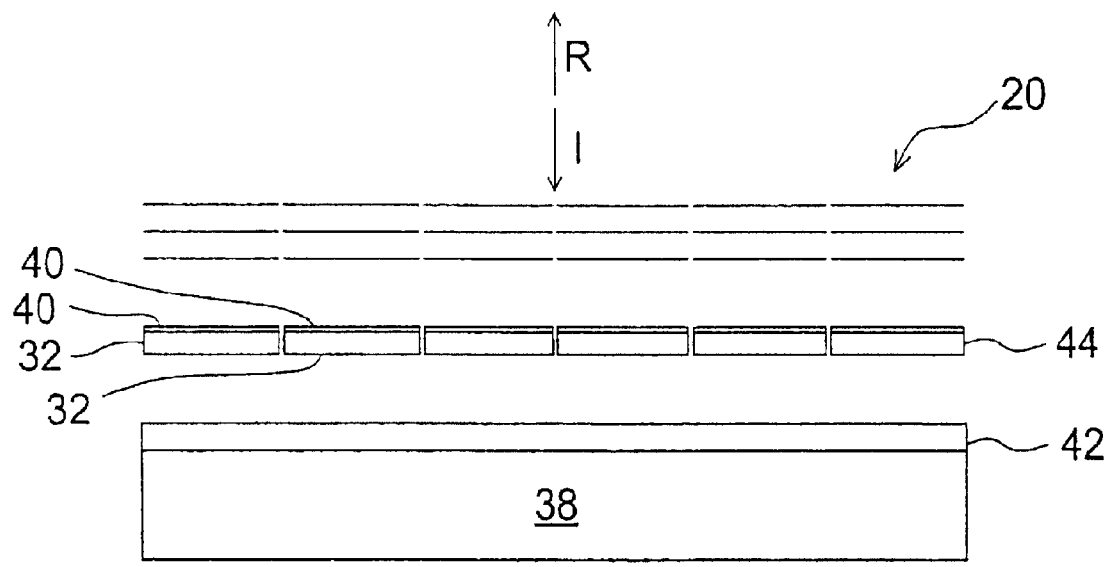
FIG. 4 illustrates the grating light valve™ light modulator of the preferred external cavity laser of the present invention in a reflection mode.
Figure 5:
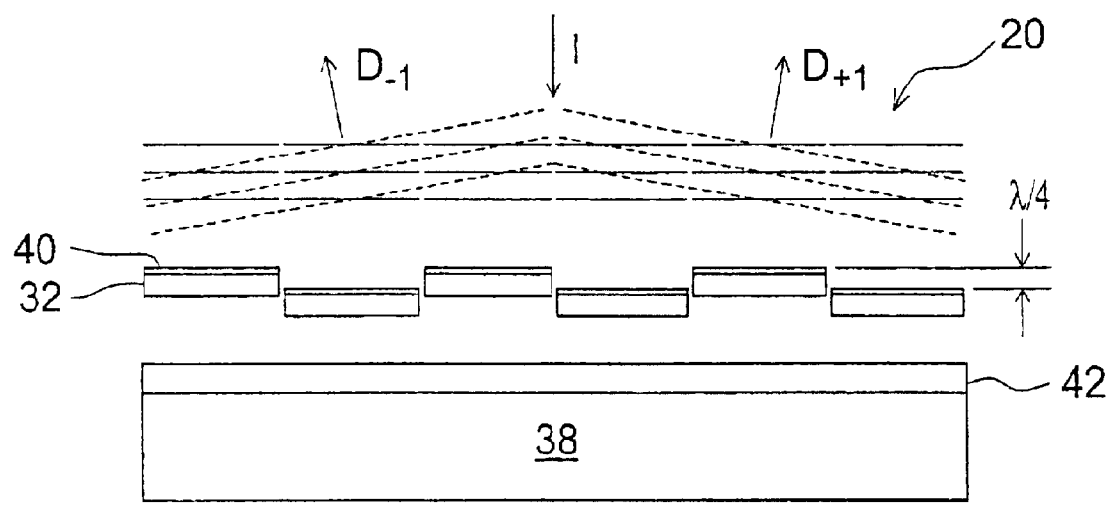
FIG. 5 illustrates the grating light valve™ light modulator of the preferred external cavity laser of the present invention in a diffraction mode.

A cross-section of the grating light valve™ light modulator 20 of the present invention is further illustrated in FIGS. 4 and 5. The grating light valve™ light modulator 20 comprises the elongated elements 32 suspended above the substrate 38. The elongated elements comprise the conducting and reflecting surface 40 and a resilient material 44. The substrate 38 comprises the conductor 42.

FIG. 4 depicts the grating light valve™ light modulator 20 in the reflection mode. In the reflection mode, the conducting and reflecting surfaces 40 of the elongated elements 32 form a plane so that incident light I reflects from the elongated elements 32 to produce reflected light R.

FIG. 5 depicts the grating light valve™ light modulator 20 in the diffraction mode. In the diffraction mode, an electrical bias causes alternate ones of the elongated elements 32 to move toward the substrate 38. The electrical bias is applied between the reflecting and conducting surfaces 40 of the alternate ones of the elongated elements 32 and the conductor 42. The electrical bias results in a height difference of a quarter wavelength λ/4 of the incident light I between the alternate ones of the elongated elements 32 and non-biased ones of the elongated elements 32. The height difference of the quarter wavelength λ/4 produces diffracted light including plus one and minus one diffraction orders, $D_{+1}$, and $D_{-1}$.

FIGS. 4 and 5 depict the grating light valve™ light modulator 20 in the reflection and diffraction modes, respectively. For a deflection of the alternate ones of the elongated elements 32 of less than a quarter wavelength λ/4, the incident light I both reflects and diffracts producing the reflected light R and the diffracted light including the plus one and minus one diffraction orders, $D_{+1}$ and $D_{-1}$. In other words, by deflecting the alternate ones of the elongated elements less the quarter wavelength λ/4, the grating light valve™ light modulator 20 produces a variable reflectivity.

While FIGS. 3, 4, and 5 depict the grating light valve™ light modulator 20 having six of the elongated elements 32, the grating light valve™ light modulator 20 preferably includes more of the elongated elements 32. By providing more of the elongated elements 32, the elongated elements 32 are able to function as groups, which are referred to as pixels. Preferably, each pixel is a group of two of the elongated elements 32. Alternatively, each pixel is a group of more elongated elements 32. Preferably, the grating light valve™ light modulator 20 includes 3,240 of the pixels. Alternatively, the grating light valve™ light modulator 20 includes more or less of the pixels.

It will be readily apparent to one skilled in the art that the term "pixel" is used here in the context of an element of a light modulator rather than its more specific definition of a picture element of a display.

First through seventh pixels of the grating light valve™ light modulator 20 of the present invention are illustrated in FIGS. 6A and 6B. In FIGS. 6A and 6B, the first, second, sixth, and seventh pixels, 46, 47, 51, and 52, are in the diffraction mode and the third, fourth, and fifth pixels, 48, 49, and 50, are in the reflection mode.

In FIG. 6A, the alternate ones of the elongated elements 32 of the first, second, sixth, and seventh pixels, 46, 47, 51, and 52, are deflected towards the substrate 38 by the quarter wavelength λ/4 so that the first, second, sixth, and seventh pixels, 46, 47, 51, and 52, diffract the incident light I into the diffracted light including the plus one and minus one diffraction orders, $D_{+1}$ and $D_{-1}$. Meanwhile, the elongated elements 32 of the third, fourth, and fifth pixels, 48, 49, and 50, reflect the incident light I to form the reflected light R. The reflecting surfaces 40 of the elongated elements 32 of the third, fourth, and fifth pixels, 48, 49, and 50, and the reflecting surfaces 40 of remaining ones of the elongated elements 32 of the first, second, sixth, and seventh pixels, 46, 47, 51, and 52, lie in a first operating plane 54.

In FIG. 6B, an additional bias is applied to the elongated elements 32 so that the first through seventh pixels, 46 . . . 52, move toward the substrate 38 by a half wavelength $\lambda/2$. This places the reflecting surfaces 40 of the elongated elements 32 of the third, fourth, and fifth pixels, 48, 49, and 50, and the reflecting surfaces 40 of the remaining ones of the elongated elements 32 of the first, second, sixth, and seventh pixels, 46, 47, 51, and 52, in a second operating plane 56.

Thus, by controllably biasing the elongated elements 32, the third pixel 48 is placeable in an operating plane selected from a range defined by the first and second operating planes, 54 and 56. In other words, the operating plane of the third, fourth, and fifth pixels, 48, 49, and 50, are placeable in a location normal to the operating plane within the range and including zero and the half wavelength $[0, \lambda/2]$.

It will be readily apparent to one skilled in the art that adjusting the operating plane of the reflecting pixel does not require adjusting a diffraction operating plane for diffracting pixels.

In operation, the preferred external cavity laser 10 (FIG. 1) of the present invention operates to select and output a particular lasing wavelength from the range of lasing wavelengths 28 (FIG. 2) of the laser source 12. When the laser source 12 is first energized, the laser source. 12 weakly outputs the range of lasing wavelengths 28, which are collimated by the collimation lens 14 and directed by the collimation lens 14 onto the blazed diffraction grating 16. The blazed diffraction grating 16 diffracts the multiple lasing wavelengths 28 into a first diffraction order. The first diffraction order comprises first, second, and third lasing wavelengths, $\lambda_1$, $\lambda_2$, and $\lambda_3$. The blazed diffraction grating 16 disperses the first diffraction order comprising the first, second, and third lasing wavelengths, $\lambda_1$, $\lambda_2$, and $\lambda_3$, into first, second, and third angles, $\theta_1$, $\theta_2$, and $\theta_3$.

The transform lens 18 converts the first, second, and third angles, $\theta_1$, $\theta_2$, and $\theta_3$, of the first, second, and third lasing wavelengths, $\lambda_1$, $\lambda_2$, and $\lambda_3$, into position along the grating light valve™ light modulator 20, which is located in a transform plane 24. The first lasing wavelength $\lambda_1$ focuses onto an eighth pixel 58 of the grating light valve™ light modulator 20. The second lasing wavelength $\lambda_2$ focuses onto a ninth pixel 60 of the grating light valve™ light modulator 20. The third lasing wavelength $\lambda_3$ focuses onto an tenth pixel 62 of the grating light valve™ light modulator 20. Placing the eighth and tenth pixels, 58 and 62, in the diffracting mode causes the first and third lasing wavelengths, $\lambda_1$ and $\lambda_3$, to be diffracted away from the return path to the laser source 12. Placing the ninth pixel 60 in the reflecting mode causes the second lasing wavelength $\lambda_2$ to be reflected along the return path to the laser source 12.

The return path forms an external cavity of the preferred external cavity laser 10 of the present invention. A first end of the external cavity comprises the grating light valve™ light modulator 20. A second end of the external cavity comprises the high reflectance mirror at the first side 22 of the laser source 12. In order for the external cavity to provide lasing, the external cavity must meet a resonant condition. For the second lasing wavelength $\lambda_2$, the resonant condition is met when the external cavity length is one half of an integral multiple of the second lasing wavelength $\lambda_2$. In other words, the resonant condition is given by $L=N\lambda/2$, where L is an optical length of the external cavity and N is an integer.

As discussed above, the grating light valve™ light modulator 20 is selectively operable to adjust an operating plane of a pixel within the range of zero to the half wavelength $[0, \lambda/2]$. This is accomplished by selectively adjusting a height of the operating plane of a reflecting pixel. This provides a tuning capability for the external cavity so that the external cavity meets the resonant condition. Thus, the operating plane of the ninth pixel 60 is adjusted so that the return path meets the resonant condition. This causes lasing for the second lasing wavelength $\lambda_2$.

With the grating light valve™ light modulator 20 operating to select the second lasing wavelength $\lambda_2$ and to create the resonant cavity for the second lasing wavelength $\lambda_2$, the preferred external cavity laser 10 outputs the second lasing wavelength $\lambda_2$ as a zeroth order 68 of the blazed diffraction grating 16. If the grating light valve™ light modulator 20 is operated to select the first lasing wavelength $\lambda_1$ and to create the resonant cavity for the first lasing wavelength $\lambda_1$, the preferred external cavity laser 10 outputs the first lasing wavelength $\lambda_1$ as the zeroth order 68 of the blazed diffraction grating 16. If the grating light valve™ light modulator 20 is operated to select the third lasing wavelength $\lambda_3$ and to create the resonant cavity for the third lasing wavelength $\lambda_3$, the preferred external cavity laser 10 outputs the third lasing wavelength $\lambda_3$ as the zeroth order 68 of the blazed diffraction grating 16.

The preferred external cavity laser 10 of the present invention provides significant advantages over other tunable lasers. First, because the operating plane of the reflecting pixel is precisely adjustable to meet the resonant condition, which is free from mode-hopping, the preferred external cavity laser 10 operates efficiently for any lasing wavelength within the laser source gain curve 26 (FIG.2).

Second, because the pixels of the grating light valve™ light modulator 20 have a response time of about 10 $\mu$sec, tuning of the operating plane of the reflecting pixels occurs rapidly.

Third, also because of the 10 $\mu$sec response time of the pixels of the grating light valve™ light modulator 20, the preferred external cavity laser 10 provides fast switching between lasing wavelengths. In other words, when a need arises to switch lasing wavelengths from an initial lasing wavelength to a subsequent lasing wavelength, the 10 $\mu$sec response time of the pixels of the grating light valve™ light modulator 20 provides rapid switching.

Fourth, because the grating light valve™ light modulator 20 provides variable reflectivity, the grating light valve™ light modulator 20 provides an ability to reduce an intensity of a lasing wavelength near a center of the laser source gain curve 26. In other words, the preferred external cavity laser 10 of the present invention is operable to produce multiple lasing wavelengths having proximately equal intensities and proximately equal spectral line-width. This may be more easily understood with reference to FIG. 2. Included within the range of lasing wavelengths 28 are fourth through eighth lasing wavelengths, $\lambda_4$, $\lambda_5$, $\lambda_6$, $\lambda_7$, and $\lambda_8$. If either the fourth lasing wavelength $\lambda_4$ or the eighth lasing wavelength $\lambda_8$ is chosen as the lasing wavelength, the pixel of the grating light valve™ light modulator 20 which reflects the lasing wavelength would preferably be operated in a fully reflecting mode to provide a desired output intensity and a desired spectral line-width. If the fifth, sixth, or seventh lasing wavelength, $\lambda_5$, $\lambda_6$, or $\lambda_7$, is chosen as the lasing wavelength, the pixel of the grating light valve™ light modulator which reflects the lasing wavelength would preferably be operated in a partially reflecting mode to provide the desired output intensity and the desired spectral line-width. In other words, for the fifth, sixth, or seventh lasing wavelength, the pixel would preferably be operated to make use of the variable reflectivity that is available from the grating light valve™ light modulator 20.

The preferred application for the preferred external cavity laser 10 of the present invention is as a wavelength selectable laser for use in a WDM (wavelength division multiplexing) system. For a 1,550 nm WDM band, the wavelength selectable laser would preferably employ the InGaAsP laser source diode source having a useful gain curve over the range of from 1,525 to 1,575 nm. Designing the laser diode source to provide fifty lasing wavelengths having a 1 nm wavelength separation provides a single laser source capable of selectively outputting a particular lasing wavelength selected from the fifty lasing wavelengths.

It will be readily apparent to one skilled in the art that other various modifications may be made to the embodiments without departing from the spirit and scope of the invention as defined by the appended claims.

We claim:

1. An external cavity laser comprising:
   a. a laser source operable to produce a light output comprising a range of light wavelengths;
   b. a collimation optical element coupled to the laser source to collimate the light output, thereby forming a collimated light output;
   c. a blazed diffraction grating coupled to the collimation optical element and diffracting the collimated light output into a first diffraction order;
   d. a transform optical element coupled to the blazed diffraction grating, the transform optical element converting the first diffraction order to position in a transform plane by focusing the range of light wavelengths to the transform plane; and
   e. a light modulator coupled to the transform optical element and located proximately in the transform plane, the light modulator comprising an array of light modulating pixels selectively operable in a first mode and a second mode where a particular light modulating pixel in the first mode reflects light along a return path, where the particular light modulating pixel in the second mode directs light away from the return path, and where the first mode is selectively operable to adjust a return path length by at least a half wavelength such that in operation at least one of the light modulating pixels operates in the first mode returning a lasing wavelength along the return path and creating a resonant cavity for the lasing wavelength while operating a remainder of the light modulating pixels in the second mode to direct a remainder of the range of light wavelengths away from the return path.

2. The external cavity laser of claim 1 wherein the laser source comprises a laser diode source.

3. The external cavity laser of claim 2 wherein the laser diode source comprises an InGaAsP laser diode source.

4. The external cavity laser of claim 1 wherein the collimation optical element comprises a collimation lens.

5. The external cavity laser of claim 1 wherein the transform optical element comprises a transform lens.

6. The external cavity laser of claim 1 wherein the laser source and the light modulator comprise a laser cavity and further wherein the laser cavity comprises a mirror at an end of the laser cavity opposite to the light modulator.

7. The external cavity laser of claim 6 wherein the blazed diffraction grating further diffracts the collimated light output into a zeroth order.

8. The external cavity laser of claim 7 wherein the zeroth order comprises a laser output.

9. The external cavity laser of claim 6 wherein the mirror at the end of the laser cavity opposite to the light modulator comprises a partially reflecting mirror and further wherein a laser output exits the laser cavity through the partially reflecting mirror.

10. The external cavity laser of claim 1 wherein the light modulator comprises a diffractive light modulator.

11. The external cavity laser of claim 10 wherein the diffractive light modulator comprises elongated elements arranged parallel to each other and further wherein each elongated element comprises a reflective surface and a flexible material.

12. The external cavity laser of claim 11 wherein the first mode comprises a reflection mode and further wherein the particular light modulating pixel in the reflection mode comprises means for placing the reflective surfaces of a group of elongated elements in the transform plane.

13. The external cavity laser of claim 12 wherein adjusting the return path length by at least the half wavelength for the particular light modulating pixel comprises means for moving the reflective surfaces of the group of elongated elements away from the transform lens.

14. The external cavity laser of claim 11 wherein the second mode comprises a diffraction mode.

15. The external cavity laser of claim 14 wherein the particular light modulating pixel in the diffraction mode comprises a group of elongated elements comprising first elongated elements interdigitated with second elongated elements and further wherein a height difference between the first elongated elements and the second elongated elements causes the light to diffract away from the return path.

16. The external cavity laser of claim 11 wherein the diffractive light modulator comprises a substrate located adjacent to the elongated elements and further wherein the elongated elements comprise a conducting element.

17. The external cavity laser of claim 16 wherein a height of an elongated element relative to the substrate is adjusted by means for applying an electrical bias between the substrate and the conducting element.

18. An external cavity laser comprising:
   a. a laser diode source operable to produce a light output comprising a range of light wavelengths;
   b. a collimation optical element coupled to the laser diode source to collimate the light output, thereby forming a collimated light output;
   c. a blazed diffraction grating coupled to the collimation optical element and diffracting the collimated light output into a first diffraction order;
   d. a transform optical element coupled to the blazed diffraction grating, the transform optical element converting the first diffraction order to position in a transform plane by focusing the range of light wavelengths to the transform plane; and
   e. a diffractive light modulator coupled to the transform optical element and located in the transform plane, the diffractive light modulator comprising an array of light modulating pixels selectively operable in a reflection mode and a diffraction mode where a particular light modulating pixel in the reflection mode reflects light along a return path, where the particular light modulating pixel in the diffraction mode directs light away from the return path, and where the reflection mode is selectively operable to adjust a return path length by at least a half wavelength such that in operation at least one of the light modulating pixels operates in the reflection mode returning a lasing wavelength along the return path and creating a resonant cavity for the lasing wavelength while operating a remainder of the light modulating pixels in the diffraction mode to direct a remainder of the range of light wavelengths away from the return path.

19. An external cavity laser comprising:
a. means for producing a light output from a laser source where the laser source is operable to produce a range of light wavelengths;
b. means for collimating the light output, thereby forming a collimated light output;
c. means for diffracting the collimated light output into a first diffraction order;
d. means for transforming the first diffraction order from angle to position in a transform plane;
e. means for modulating light in the transform plane comprising an array of light modulating pixels selectively operable in a first mode and a second mode where a particular light modulating pixel in the first mode reflects light along a return path, where the particular light modulating pixel in the second mode directs light away from the return path, and where the first mode is selectively operable to adjust a return path length by at least a half wavelength such that in operation at least one of the light modulating pixels operates in the first mode returning a lasing wavelength along the return path and creating a resonant cavity for the lasing wavelength while operating a remainder of the light modulating pixels in the second mode to direct a remainder of the range of light wavelengths away from the return path.

\* \* \* \* \*